(12) United States Patent
Okada et al.

(10) Patent No.: US 10,288,981 B2
(45) Date of Patent: May 14, 2019

(54) LASER LIGHT-SOURCE APPARATUS AND LASER PULSE LIGHT GENERATING METHOD

(71) Applicant: SPECTRONIX CORPORATION, Suita-shi, Osaka (JP)

(72) Inventors: Joji Okada, Suita (JP); Yosuke Orii, Suita (JP); Shinichi Murayama, Suita (JP); Daisuke Okuyama, Suita (JP)

(73) Assignee: SPECTRONIX CORPORATION, Osaka (JP)

( * ) Notice: Subject to any disclaimer, the term of this patent is extended or adjusted under 35 U.S.C. 154(b) by 0 days.

(21) Appl. No.: 15/549,366

(22) PCT Filed: Mar. 30, 2016

(86) PCT No.: PCT/JP2016/060371
§ 371 (c)(1),
(2) Date: Dec. 19, 2017

(87) PCT Pub. No.: WO2016/125919
PCT Pub. Date: Aug. 11, 2016

(65) Prior Publication Data
US 2018/0129114 A1 May 10, 2018

(30) Foreign Application Priority Data
Feb. 6, 2015 (JP) .................... 2015-022465

(51) Int. Cl.
*G02F 1/35* (2006.01)
*H01S 3/10* (2006.01)
(Continued)

(52) U.S. Cl.
CPC ............ *G02F 1/353* (2013.01); *G02F 1/3551* (2013.01); *G02F 1/37* (2013.01); *H01S 3/0092* (2013.01);
(Continued)

(58) Field of Classification Search
CPC .............................. G02F 1/353; G02F 1/3551
See application file for complete search history.

(56) References Cited

U.S. PATENT DOCUMENTS 7,813,389 B2 * 10/2010 Peng ................... H01S 3/06754
372/26
9,680,285 B2 * 6/2017 Okada ..................... H01S 3/106
(Continued)

FOREIGN PATENT DOCUMENTS

| JP | 2005-539365 A | 12/2005 |
| JP | 2006-88199 A | 4/2006 |

(Continued)

OTHER PUBLICATIONS

Jun. 28, 2016 International Search Report issued in International Patent Application No. PCT/JP2016/060371.
(Continued)

*Primary Examiner* — Rhonda S Peace
(74) *Attorney, Agent, or Firm* — Oliff PLC (57) ABSTRACT

A laser light-source apparatus includes a control unit configured to perform control in such a manner that a seed light source is driven in a pulse oscillation mode of oscillating pulse light based on gain switching in an output permitted state where output of pulse light from the apparatus is permitted, and is driven in a continuous oscillation mode of oscillating continuous light in an output stopped state in which the output of the pulse light from the apparatus is stopped, with power of excitation light for a solid state amplifier maintained, and adjusts power of laser light input to the solid state amplifier from the seed light source in the continuous oscillation mode in such a manner that the solid state amplifier outputs light with substantially same average power in the output stopped state and in the output permitted state.

7 Claims, 6 Drawing Sheets

(51) Int. Cl.

| | |
|---|---|
| *H01S 3/13* | (2006.01) |
| *H01S 3/16* | (2006.01) |
| *H01S 3/106* | (2006.01) |
| *H01S 3/0941* | (2006.01) |
| *G02F 1/355* | (2006.01) |
| *G02F 1/37* | (2006.01) |
| *H01S 3/00* | (2006.01) |
| *H01S 3/11* | (2006.01) |
| *H01S 3/23* | (2006.01) |
| *H01S 3/067* | (2006.01) |
| *H01S 3/117* | (2006.01) |
| *H01S 5/062* | (2006.01) |

(52) U.S. Cl.
CPC .......... *H01S 3/067* (2013.01); *H01S 3/06754* (2013.01); *H01S 3/10* (2013.01); *H01S 3/1068* (2013.01); *H01S 3/11* (2013.01); *H01S 3/117* (2013.01); *H01S 3/1305* (2013.01); *H01S 3/23* (2013.01); *H01S 3/2316* (2013.01); *H01S 5/062* (2013.01); *G02F 2001/354* (2013.01); *H01S 3/0941* (2013.01); *H01S 3/1618* (2013.01); *H01S 2301/02* (2013.01)

(56) References Cited

U.S. PATENT DOCUMENTS

| | | | |
|---|---|---|---|
| 9,837,784 B2* | 12/2017 | Lowder | H01S 3/06754 |
| 9,859,675 B2* | 1/2018 | Okada | H01S 3/06758 |
| 2003/0081636 A1* | 5/2003 | Wang | H01S 3/117 372/10 |
| 2010/0118899 A1* | 5/2010 | Peng | H01S 3/06754 372/25 |
| 2010/0183040 A1* | 7/2010 | Ishizu | H01S 3/06754 372/25 |
| 2010/0316072 A1 | 12/2010 | Deladurantaye et al. | |
| 2011/0019705 A1 | 1/2011 | Adams et al. | |
| 2014/0049811 A1 | 2/2014 | Noh et al. | |

FOREIGN PATENT DOCUMENTS

| | | |
|---|---|---|
| JP | 2010-171131 A | 8/2010 |
| JP | 2011-192831 A | 9/2011 |
| JP | 2012-508398 A | 4/2012 |
| JP | 2016-51897 A | 4/2016 |
| WO | 2008/014331 A2 | 1/2008 |

OTHER PUBLICATIONS

Aug. 8, 2017 International Preliminary Report on Patentability issued in International Patent Application No. PCT/JP2016/060371.
Dec. 4, 2018 Office Action issued in Japanese Patent Application No. 2015-022465.
Sep. 27, 2018 Search Report issued in European Patent Application No. 16746747.1.

* cited by examiner

LASER LIGHT-SOURCE APPARATUS AND LASER PULSE LIGHT GENERATING METHOD

This application is based on an application No. 2015-022465 filed in Japan, the contents of which are hereby incorporated by reference.

FIELD OF THE INVENTION

The present invention relates to laser light-source apparatus and a laser pulse light generating method, used for various types of laser processing.

DESCRIPTION OF THE RELATED ART

In recent years, laser light is used for various types of processing. Laser light with a wavelength approximately in a range from 532 nm to 1064 nm has a high energy intensity, and are suitably used for various types of processing such as cutting or welding of metal, glass, and the like. Laser light with a wavelength in a deep ultraviolet region, which is approximately from 200 nm to 350 nm, is used for processing electronic materials and composite materials.

Laser light-source apparatus that outputs laser light with a wavelength shorter than those in a near-infrared region includes: a seed light source that outputs laser light having a wavelength in the near-infrared region; an optical amplifier that amplifies the laser light output from the seed light source; and a nonlinear optical element that converts the wavelength of the laser light, amplified by the optical amplifier, into a target wavelength.

Various optical amplifiers and the like are used for various seed light sources selected to achieve a pulse width of several nanoseconds or shorter, preferably several hundreds of picoseconds or shorter and a pulse rate of several hundreds of megahertz or lower, so that laser pulse light with large peak power is obtained.

Some conventional configurations use a mode-locked laser with a pulse rate of several tens of megahertz as such a seed light source, and pulse light of several kilohertz is obtained by dividing the frequency of the pulse light output from the seed light source.

Unfortunately, the mode-locked laser involves an oscillating frequency that is fluctuated by environmental factors such as temperature and vibration and thus is difficult to appropriately control. Thus, the frequency division needs to be synchronized with the oscillating frequency of the laser pulse light detected by using a light-receiving element and the like. Thus, a complex circuit configuration is required. Furthermore, long term stable driving is difficult to achieve because the mode-locked laser includes a saturable absorber, which is apt to degrade.

Use of a semiconductor laser that emits pulse light with a controllable oscillating frequency for the seed light source might seem like a solution. Unfortunately, the semiconductor laser is only capable of emitting near-infrared pulse light with extremely small pulse energy of several picojoules to several hundreds of picojoules. Thus, to eventually obtain the pulse light with the pulse energy of several tens of microjoules to several tens of millijoules, much stronger amplification is required than in the case where the conventional seed light source is used.

Suitable examples of the optical amplifier achieving such strong amplification include: a fiber amplifier such as an erbium-doped fiber amplifier and an ytterbium-doped fiber amplifier; and a solid state amplifier such as Nd:YAG obtained by adding neodymium to yttrium aluminum garnet and Nd:YVO4 obtained by adding neodymium to yttrium vanadate.

Patent document 1 and Patent document 2 each disclose an optical amplifier as a combination of the fiber amplifier and the solid state amplifier described above. As described in Patent document 1 and Patent document 2, the fiber amplifier and the solid state amplifier both require an excitation light source for amplifying light with the same wavelength as laser light amplified by a pumping effect in a laser active region. Generally, a semiconductor laser is used for such an excitation light source.

PRIOR ART DOCUMENTS

Patent Documents

[Patent document 1] Japanese Unexamined Patent Application Publication No. 2011-192831
[Patent document 2] WO2008/014331

SUMMARY OF INVENTION

Problems to be Solved by the Invention

There might be cases where the output of the pulse light should be temporarily stopped during a processing work performed by using the pulse light output from the laser light-source apparatus. In such a case, stopping of the oscillation of the seed light source or the stopping of the propagation of the pulse light to the optical amplifier leads to an excessive population inversion state because the laser active region of each optical amplifier continues to be excited by an excitation laser light source, provided in the optical amplifier. As a result, the next time the seed light source is oscillated or the propagation of the pulse light to the optical amplifier is permitted, pulse light (hereinafter, also referred to as "giant pulse") with peak power extremely larger than that in a normal state is output to damage the solid state amplifier, the nonlinear optical element, or the like.

The output of the pulse light may be temporarily stopped, with the excitation laser beam source kept driving, and then resume. In such a case, an excessively large amount of energy is accumulated due to the excitation light while the output is being stopped, and temperature excessively rises in the optical amplifier. Thus, for example, in the fiber amplifier, power of the ASE noise increases or the fiber length changes to cause fluctuation of the frequency of the output light. In the solid state amplifier, the beam propagation characteristics degrade due to thermal lens effect occurring in a solid state laser medium. Thus, the quality of the processing target using the laser pulse light might be negatively affected, until the stable temperature is achieved after the output has resumed.

Thus, when the output of the pulse light is temporarily stopped, for example, the power of pulse light from the excitation laser beam source of the solid state amplifier may be reduced, so that the adjustment for preventing the excessive amount of energy from accumulating in the solid state laser medium can be achieved.

However, the variable adjustment of the power of the excitation light, which can regulate the temperature rise of the solid state laser medium, involves fluctuation of power of the excitation light leading to the thermal lens effect resulting in displacement of the beam center of the pulse light when the output of the pulse light is resumed. More specifically, the optical axis of the excitation light incident on the solid state laser medium is difficult to accurately adjust, and thus is likely to be negatively affected by thermal lens effect due to the fluctuation of the temperature distribution state of the solid state laser medium attributable to the fluctuation of the power of the excitation light.

In view of the problems described above, an object of the present invention is to provide a laser light-source apparatus and a laser pulse light generating method in which when an output of pulse light from the apparatus is temporarily stopped, a solid state amplifier can be prevented from being damaged, so that degradation of the beam propagation characteristics immediately after the output is resumed can be prevented, without stopping or adjusting an excitation light source.

Means for Solving the Problems

A first characteristic configuration of a laser light-source apparatus according to the present invention, for achieving the object described above, is that, as set forth in claim 1: a laser light-source apparatus includes: a seed light source configured to output pulse light based on gain switching; an amplifier configured to amplify the pulse light output from the seed light source; and a control unit configured to perform control in such a manner that the seed light source is driven in a pulse oscillation mode of oscillating the pulse light based on the gain switching in an output permitted state where output of the pulse light from the laser light-source apparatus is permitted, and is driven in a continuous oscillation mode of oscillating continuous light in an output stopped state in which the output of the pulse light from the laser light-source apparatus is stopped, with power of excitation light for the amplifier maintained, and to adjust power of laser light input to the amplifier from the seed light source in the continuous oscillation mode in such a manner that the amplifier outputs light with substantially same average power in the output stopped state and in the output permitted state.

The control unit performs control in such a manner that, in the output permitted state, the amplifier amplifies the pulse light output from the seed light source based on the gain switching so that pulse light with peak power high enough for processing a processing target object can be obtained for example, and in the output stopped state, the seed light source outputs continuous light, in the continuous oscillation mode, with power sufficiently lower than the power with which the processing target object can be processed, even after the amplification by the amplifier. When the output permitted state transitions to the output stopped state with the power of the excitation light for the amplifier maintained, the excitation energy accumulated in the amplifier due to the excitation light is consumed by the continuous light output from the seed light source in the continuous oscillation mode. Thus, the excessive heat emission of the amplifier changing the amplification characteristics can be prevented with no cumbersome control for switching the power of the excitation light for the amplifier. Thus, the pulse light can be output with stable amplification characteristics, when the transition to the output permitted state occurs thereafter.

A second characteristic configuration of the laser light-source apparatus according to the present invention is that, as set forth in claim 2: the amplifier may at least include a solid state amplifier, and the control unit may be configured to adjust the power of laser light input to the solid state amplifier from the seed light source in the continuous oscillation mode in such a manner that the solid state amplifier outputs light with substantially same average power in the output stopped state and in the output permitted state, in addition to the first characteristic configuration described above.

When the solid state amplifier is used as an amplifier for amplifying the pulse light output from the seed light source and the excitation state of the solid state amplifier due to the excitation light fluctuate, the optical axis of the pulse light output from the solid state amplifier slightly fluctuates due to the influence of thermal lens effect or the like. This it have a large impact on the processing accuracy of the processing target object for example. Thus, stable thermal state of the solid state amplifier is desired to be maintained even when the output permitted state transitions to the output stopped state. When the output permitted state transitions to the output stopped state, the excitation energy accumulated in the solid state amplifier may be consumed by the continuous light output from the seed light source in the continuous oscillation mode. With this configuration, the stable thermal state of the solid state amplifier is maintained even when the power of the excitation light for the solid state amplifier is maintained. As a result, the beam propagation characteristics do not deteriorate due to the change in the temperature characteristics of the solid state amplifier even when the transition to the output permitted state occurs thereafter. All things considered, the processing accuracy of the processing target object can be appropriately maintained.

A third characteristic configuration of the laser light-source apparatus according to the present invention is that, as set forth in claim 3: a nonlinear optical element configured to perform wavelength conversion on the pulse light output from the solid state amplifier and output the resultant pulse light may be further provided, and the nonlinear optical element is configured to output wavelength converted light with predetermined power only in the output permitted state, in addition to the second characteristic configuration described above.

The power of the pulse light after the wavelength conversion by the wavelength conversion element has positive correlation with the power of the input light. Thus, the intensity needs to be amplified to a sufficient level with the solid state amplifier, with the seed light source driven in the pulse oscillation mode with which the pulse light with high peak power can be obtained. However, the power of the continuous light output from the seed light source in the continuous oscillation mode is low. Thus, the wavelength converted light with sufficient power cannot be obtained from the wavelength conversion element even when such light is amplified by the solid state amplifier. Thus, in the output stopped state in which the output of the pulse light from the nonlinear optical element is stopped, the seed light source may be switched from the pulse oscillation mode to the continuous oscillation mode to be driven. Thus, the output stopped state can be substantially be achieved with the stable thermal state of the solid state amplifier maintained. Thus, the nonlinear optical element functions as a filter element that selectively converts the wavelength of the pulse light output from the seed light source 10, regardless of whether the oscillation wavelengths are the same or different from each other, so that the pulse light can be output with power high enough to process the processing target object.

A fourth characteristic configuration of the laser light-source apparatus according to the present invention is that, as set forth in claim 4: the seed light source may include a DFB laser, and the control unit may be configured to drive the DFB laser with a frequency of several megahertz or lower and a pulse width of several hundreds of picoseconds or shorter.

When the DFB laser employing the gain switching is used as the seed light source and is driven in the pulse oscillation mode of oscillating pulse light based on the gain switching. Thus, longitudinal mode pulse light including single pulse light can be easily generated with a desired pulse width that is several hundreds of picoseconds or less, at a desired frequency not larger than several megahertz.

A first characteristic configuration of a laser pulse light generating method according to the present invention is, as set forth in claim 5: a laser pulse light generating method in which pulse light output from a seed light source based on gain switching is sequentially amplified by a fiber amplifier and a solid state amplifier, subjected to wavelength conversion by a nonlinear optical element, and then is output, includes driving the seed light source with a pulse oscillation mode of oscillating the pulse light based on the gain switching switched to a continuous oscillation mode of oscillating continuous light, with power of excitation light for the solid state amplifier maintained and adjusting power of laser light input to the solid state amplifier from the seed light source in the continuous oscillation mode in such a manner that the solid state amplifier outputs light with substantially the same average power as in the state where the output of the pulse light from the nonlinear optical element is permitted, when the output of the pulse light from the nonlinear optical element is stopped.

Effects of Invention

As described above, the present invention can provide a laser light-source apparatus and a laser pulse light generating method in which when an output of pulse light from the apparatus is temporarily stopped, a damage of a solid state amplifier can be prevented and thus degradation of beam propagation characteristics immediately after the output is resumed can be prevented, without stopping or adjusting an excitation light source.

DESCRIPTION OF THE PREFERRED EMBODIMENTS

Embodiments of a laser light-source apparatus and a laser pulse light generating method according to the present invention are described below.

Figure 1:
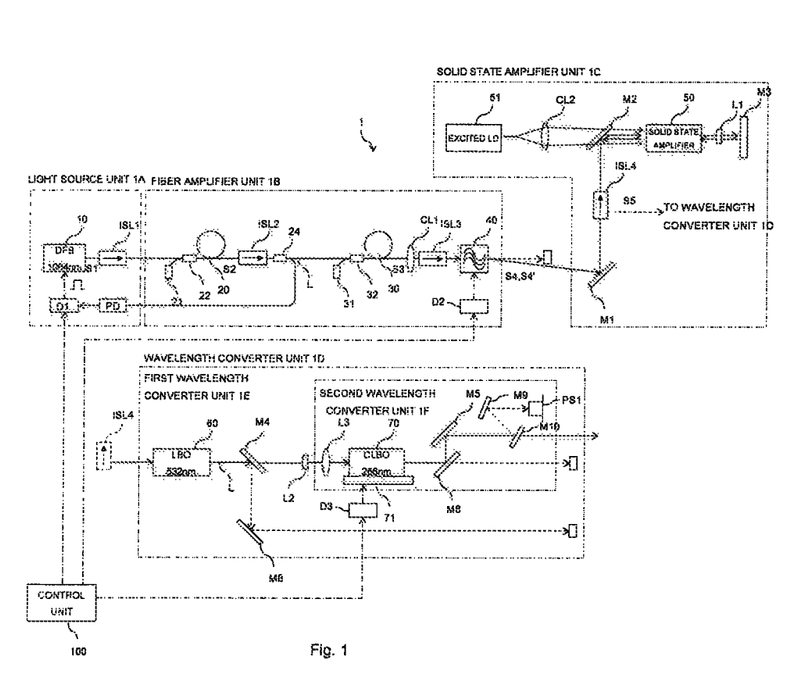
FIG. 1 is a block diagram illustrating a configuration of a laser light-source apparatus according to the present invention.

FIG. 1 illustrates an example of a configuration of a laser light-source apparatus 1 according to the present invention. The laser light-source apparatus 1 includes a light source unit 1A, a fiber amplifier unit 1B, a solid state amplifier unit 1C, and a wavelength conversion unit 1D that are arranged along an optical axis L, and further includes a control unit 100 that controls the light source unit 1A and the like.

The light source unit 1A includes a seed light source 10, a driver D1, and an optical isolator ISL1 and the like. The fiber amplifier unit 1B includes: fiber amplifiers 20 and 30, in two stages, respectively including excitation light sources 21 and 31, each including a laser diode, and multiplexers 22 and 32; optical isolators ISL2 and ISL3; an optical switching element 40; and the like.

The solid state amplifier unit 1C includes a solid state amplifier 50, an excitation light source 51, reflection mirrors M1, M2, and M3, a lens L1, a collimator CL2, and the like. The wavelength conversion unit 1D includes a first wavelength conversion unit 1E and a second wavelength conversion unit 1F that are respectively provided with nonlinear optical elements 60 and 70.

Laser pulse light (hereinafter, also simply referred to as "pulse light") with a wavelength of 1064 nm, output from the seed light source 10 in a pulse oscillation mode, is amplified by the fiber amplifiers 20 and 30 in the two stages, and then is further amplified to a desired level by the solid state amplifier 50 in a single stage. The pulse light amplified by the solid state amplifier 50 is subjected to wavelength conversion by the nonlinear optical element 60 to have a wavelength of 532 nm, further subjected to wavelength conversion by the nonlinear optical element 70 to have a wavelength of 266 nm, and then is output.

The number of fiber amplifiers and solid state amplifiers are not particularly limited, and may be set as appropriate to achieve a desired amplification gain for the pulse light. For example, three fiber amplifiers may be cascaded, and two solid state amplifiers may be cascaded in the subsequent stage.

A distributed feedback laser diode (hereinafter, referred to as a "DFB laser") that outputs a single longitudinal mode laser light is used for the seed light source 10 and is driven in any one of the pulse oscillation mode and a continuous oscillation mode, in accordance with a control signal output from the control unit 100. The DFB laser outputs pulse light with a monochromatic wave or a desired frequency that is several megahertz or lower and having a desired pulse width that is several nanoseconds or shorter and is preferably several hundreds of picoseconds or shorter in the pulse oscillation mode, and outputs continuous light (CW light) with low power in the continuous oscillation mode.

The pulse light, having the pulse energy of several to several hundreds of picojoules, output from the seed light source 10 in the pulse oscillation mode, is amplified by the fiber amplifiers 20 and 30 and the solid state amplifier 50 to have the final pulse energy of several tens of microjoules to several tens of millijoules. Then, the resultant pulse light is input to the two-stage nonlinear optical elements 60 and 70 to be subjected to the wavelength conversion. As a result, deep ultraviolet light with a wavelength of 266 nm is obtained.

The pulse light output from the seed light source 10 is amplified in the fiber amplifier 20 on the upstream stage, through the optical isolator ISL1. A rare-earth-doped optical fiber, such as an ytterbium (Yb)-doped fiber amplifier excited by the excitation light source 21 with a predetermined wavelength (for example 975 nm) is used for the fiber amplifiers 20 and 30. The population inversion of such a fiber amplifier 20 lasts for milliseconds, and thus energy excited by the excitation light source 21 is efficiently transferred to the pulse light having a frequency of 1 kilohertz or higher.

The pulse light that has been amplified by the fiber amplifier 20 on the upstream stage by about 30 decibels is input to the fiber amplifier 30 on the downstream stage through the optical isolator ISL2 to be amplified by about 25 decibels. The pulse light that has been amplified in the fiber amplifier 30 on the downstream stage is subjected to beam shaping by a collimator CL1, and then is guided to the solid state amplifier 50, after passing through the optical isolators ISL3 and ISL4, to be amplified by about 25 decibels.

An Acousto-Optic Modulator (AOM) that includes an acousto-optic element and functions as the optical switching element 40 and a pair of reflection mirrors M1 and M2 are disposed between the collimator CL1 and the solid state amplifier 50. An optical isolator ISL4 that guides the pulse light amplified by the solid state amplifier 50 to the nonlinear optical element 60 is disposed between the reflection mirrors M1 and M2.

The optical isolators ISL1 to ISL4 described above are each a polarization-dependent optical isolator that blocks return light by rotating the plane of polarization to be in a reverse direction for a direction opposite to the forward direction, through the magneto-optical effect. Thus, the optical isolators ISL1 to ISL4 are disposed, for example, to prevent the optical elements disposed on the upstream side along the optical axis from breaking due to heat of the return light with a high intensity.

A solid state laser medium such as a Nd:YVO4 crystal or a Nd:YAG crystal is preferably used for the solid state amplifier 50. The solid state laser medium is excited by excitation light output from the excitation light source 51, including a laser diode that emits light having a wavelength of 808 nm or 888 nm, and then is subjected to beam shaping by the collimator CL2.

The pulse light that has passed through the optical switching element 40 enters the solid state amplifier 50 via the reflection mirrors M1 and M2 to be amplified, and then is reflected by the reflection mirror M3 to reenter the solid state amplifier 50 to be amplified again. Thus, the pulse light is amplified while passing through the solid state amplifier 50 in opposite directions. The lens L1 is for beam shaping.

The pulse light amplified by the solid state amplifier 50 is reflected by the reflection mirror M2 and the optical isolator ISL4. Thus, the pulse light enters the nonlinear optical elements 60 and 70 of the wavelength conversion unit 1D to have the wavelength converted into a desired wavelength, and then is output.

The first wavelength conversion unit 1E includes a LBO crystal ($LiB_3O_5$) serving as the nonlinear optical element 60, and the second wavelength conversion unit 1F includes a CLBO crystal ($CsLiB_6O_{10}$) serving as the nonlinear optical element 70. The pulse light, with a wavelength of 1064 nm, output from the seed light source 10, is subjected to wavelength conversion in the nonlinear optical element 60 to have a wavelength of 532 nm, and then is subjected to wavelength conversion in the nonlinear optical element 70 to have a wavelength of 266 nm.

Reflection mirrors M4 and M8 function as filters for separating the pulse light having a wavelength of 1064 nm output from the nonlinear optical element 60. A reflection mirror M6 functions as a filter for separating the pulse light having a wavelength of 532 nm output from the nonlinear optical element 70. Each pulse light thus separated is attenuated by an optical damper.

The second wavelength conversion unit 1F is provided with a stage 71 serving as a scanning mechanism that causes the CLBO crystal ($CsLiB_6O_{10}$) to move in a plane orthogonal to the optical axis, so that the position on the CLBO crystal ($CsLiB_6O_{10}$) irradiated with the pulse light is shifted at a predetermined timing. This is because when the same position on the CLBO crystal ($CsLiB_6O_{10}$) is irradiated with the ultraviolet ray for a long period of time, the CLBO crystal ($CsLiB_6O_{10}$) is optically damaged to have the intensity distribution and the wavelength conversion output performance degraded.

The control unit 100 includes a circuit block including a Field Programmable Gate Array (FPGA), a peripheral circuit, and the like. A plurality of logical elements are driven based on a program stored in a memory in the FPGA in advance, so that, for example, the blocks of the laser light-source apparatus 1 are sequentially controlled. The control unit 100 may employ a configuration including a microcomputer, a memory, and a peripheral circuit such as an IO or a configuration including a programmable logic controller (PLC), instead of the configuration including the FPGA.

Specifically, the control unit 100 transmits a trigger signal, having a predetermined pulse width, to the driver D1 of the DFB laser serving as the seed light source 10, in the pulse oscillation mode in which the laser light-source apparatus outputs wavelength converted pulse light. When a pulse current, corresponding to the trigger signal, is applied to the DFB laser from the driving circuit, relaxation oscillation occurs. Here, laser pulse light is output that includes only a first wave corresponding to the highest emission intensity immediately after the start of the light emission by the relaxation oscillation and includes no sub-pulses as a second wave and after. The gain switching is a method of thus generating pulse light with a short pulse width and large peak power through the relaxation oscillation.

The control unit 100 outputs a driving signal to a driving circuit for continuous light oscillation provided to the driver D1 of the DFB laser serving as the seed light source 10, in the continuous oscillation mode in which the output of the wavelength converted pulse light from the laser light-source apparatus 1 is temporarily stopped. The driving circuit applies DC current to the DFB laser, whereby continuous light with the power based on the current value is output.

The control unit 100 outputs a gate signal to an RF driver D2 that drives the Acousto-Optic Modulator (AOM) serving as the optical switching element 40. A transducer (piezoelectric conversion element) that has received a high frequency signal from the RF driver D2 generates a diffraction grating in the crystal of the acousto-optic element, so that diffracted light of the pulse light that has entered the acousto-optic element is made incident on the reflection mirror M1. When the RF driver D2 is stopped, the pulse light passes through the acousto-optic element without being diffracted, and thus is not made incident on the reflection mirror M1. The light that has passed through the acousto-optic element while the RF driver D2 is stopped is attenuated by the optical damper.

When the optical switching element 40 is turned ON by the gate signal, the light diffracted by the acousto-optic element propagates to the solid state amplifier 50 from the fiber amplifier 30. When the optical switching element 40 is turned OFF by the gate signal, the propagation of the light to the solid state amplifier 50 from the fiber amplifier 30 is stopped.

Figure 2A:
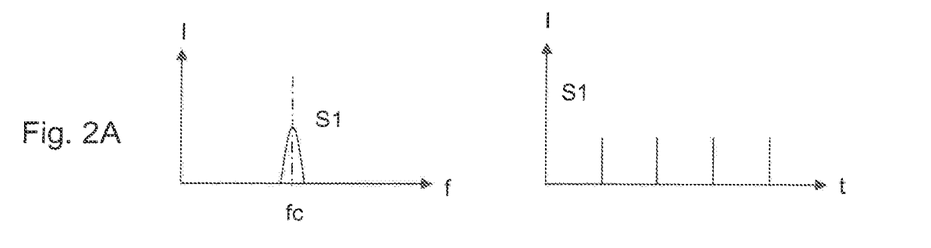
FIG. 2A is a diagram illustrating frequency and time axis characteristics of narrowband pulse light emitted from a seed light source.
Figure 2B:
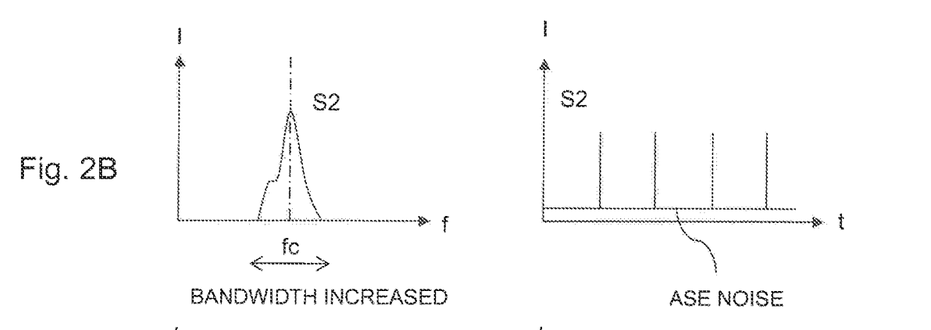
FIG. 2B and FIG. 2C are diagrams illustrating frequency characteristics and time axis characteristics of pulse light with a bandwidth increased due to self-phase modulation and Raman scattering in a fiber amplifier.
Figure 2C:
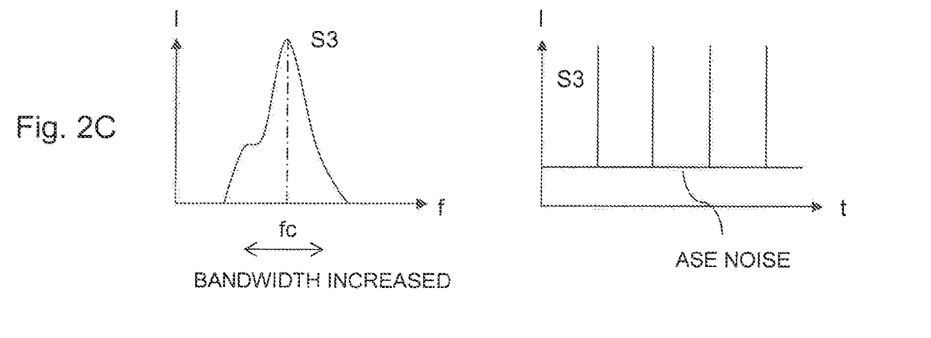

In each of FIG. 2A, FIG. 2B, and FIG. 2C, the frequency characteristics of the pulse light propagating in components of the laser light-source apparatus 1 is illustrated in a left side figure, and the time axis characteristics of the pulse light is illustrated in a right side figure. In the figures, the reference sign Sn (n is an integer) represents an optical signal Sn (n=1, 2, . . . ) from an output node of components of the laser light-source apparatus 1 illustrated in FIG. 1.

Figure 3A:
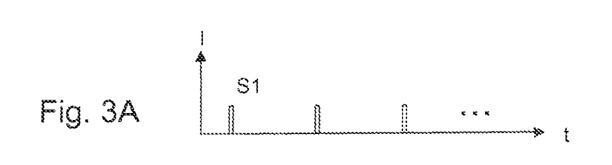
FIG. 3A is a diagram illustrating pulse light periodically emitted from the seed light source.
Figure 3B:
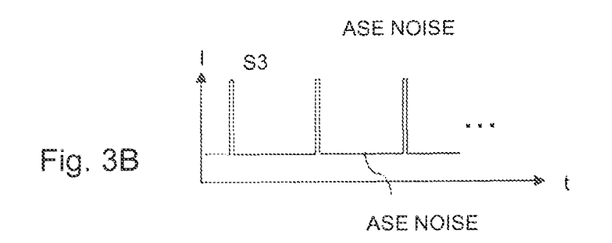
FIG. 3B is a diagram illustrating pulse light in which ASE noise has been superimposed in a downstream stage fiber amplifier.

Laser pulse light having a small bandwidth with the center wavelength of 1064 nm (see FIG. 2A and FIG. 3A) is output from the DFB laser, serving as the seed light source 10, at a predetermined cycle, in response to the trigger signal output from the control unit 100 in the pulse oscillation mode. When the pulse light output from the seed light source 10 is guided by the fiber amplifier 20 and amplified, an unwanted spectrum width increase occurs due to self-phase modulation, Raman scattering, and the like. Furthermore, amplified spontaneous emission noise (hereinafter, referred to as "ASE noise") is produced, and thus the S/N ratio of the optical pulse is degraded (see FIG. 2B). A further increase in the bandwidth and a further increase in the ASE noise level occur (see FIG. 2C and FIG. 3B) when the pulse light is guided to and amplified by the fiber amplifier 30 on the downstream stage.

The pulse light amplified by the fiber amplifiers 20 and 30 needs to be further amplified by the solid state amplifier 50 on the downstream stage to achieve larger peak power, so that the deep ultraviolet pulse light of a predetermined intensity can be obtained. The range of wavelengths achievable by the wavelength conversion by the wavelength conversion unit 1D is limited by the characteristics of the nonlinear optical elements 60 and 70. Thus, the energy used for the amplification does not efficiently contribute to the wavelength conversion. All things considered, the wavelength conversion efficiency is low.

The excitation energy of the solid state amplifier 50 is wastefully consumed for the pulse light with an increased bandwidth and the amplification of the ASP noise. Thus, the energy efficiency is low. When the excitation energy is increased to offset the wastefully consumed amount, a large scale cooling device is required for preventing damages due to emitted heat on the elements. Thus, the cost of the laser light-source apparatus 1 increases. When the frequency of the pulse light is in the order of megahertz or higher, the ASE noise is so small that would not be much of a problem. The adverse effect of the ASE noise is large when the oscillating frequency of the pulse light is in a range lower than one megahertz.

Thus, in the present embodiment, the control unit 100 controls the optical switching element 40 in such a manner that the propagation of light is permitted in an output period of the pulse light from the seed light source 10, and stopped in a period other than the output period of the pulse light from the seed light source 10 driven in the pulse oscillation mode. Thus, an output permitted state where the output of the pulse light from the nonlinear optical elements 60 and 70 is permitted is achieved.

When the control unit 100 turns OFF the optical switching element 40 in the period other than the output period of the pulse light from the seed light source 10 in the output permitted state, the ASP noise is prevented from propagating to the solid state amplifier 50 on the downstream stage in this period. As a result, the energy in an active region of the solid state amplifier 50 is prevented from being wastefully consumed (see a section Toff in FIG. 3C).

Figure 3C:
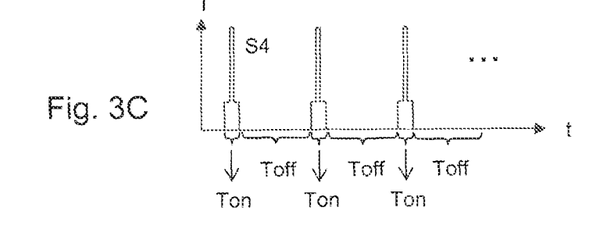
FIG. 3C is a diagram illustrating pulse light passing through an optical switching element in synchronization with an oscillation period of the seed light source in a time domain.
Figure 3D:
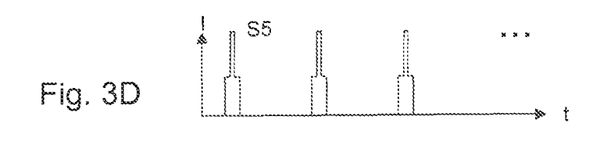
FIG. 3D is a diagram illustrating pulse light amplified by a solid state amplifier after passing through the optical switching element in synchronization with the oscillation period of the seed light source in the time domain.

Then, when the optical switching element 40 is turned ON by the control unit 100 in the output period of the pulse light from the seed light source 10, the pulse light propagates from the fiber amplifier 30 to the solid state amplifier 50 (see a section Ton in FIG. 3C). Thus, the pulse light is amplified with a high energy efficiency (see FIG. 3D), whereby the pulse light with large peak power is output from the nonlinear optical element. In this manner, the optical switching element 40 functions as a filter that removes the ASE noise in a time domain.

The "output period of the pulse light from the seed light source", in which the optical switching element 40 is ON due to the control performed by the control unit 100, in the output permitted state is not necessarily the entire output period of the pulse light from the seed light source 10, and may be a part of such a period as long as the peak power of the pulse light, obtained by the wavelength conversion by the nonlinear optical elements 60 and 70, can be within a range of appropriate values. Furthermore, the concept of the period includes short periods before and after the output period of the pulse light from the seed light source 10.

The "period other than the output period of the pulse light from the seed light source", in which the optical switching element 40 is OFF due to the control performed by the control unit 100, in the output permitted state is not necessarily the entire period including all the periods between the output periods of the plurality of pulse light beams, that is, periods without the pulse light, and may be a part of such periods as long as an amount of the energy in the active region of the solid state amplifier 50, as a result of the excitation by the excitation light source, wastefully consumed for the ASE noise can be reduced.

There might be cases where the output of the pulse light with a wavelength in the deep ultraviolet region output from the laser light-source apparatus 1 should be temporarily stopped during laser processing performed by using such pulse light. In such a case, stopping of the oscillation of the seed light source 10 or the stopping of the propagation of the pulse light to the optical amplifiers 20, 30, and 50 leads to an excessive population inversion state because each laser active region continues to be excited by excitation laser beam sources, provided in the optical amplifiers 20, 30, and 50.

As a result, the next time the seed light source is to be oscillated or the propagation of the pulse light to the optical amplifier 50 is permitted, the giant pulse is output to damage the solid state amplifier 50, the nonlinear optical element on the downstream stage, or the like.

Furthermore, while the seed light source 10 stops oscillating, the solid state amplifier 50 excessively emits heat to cause temperature rise. Thus, when the seed light source 10 resumes the oscillation, the beam propagation characteristics degrades until the temperature of the solid state amplifier 50 returns to normal temperature. This might negatively affect the quality of the processing target using the laser pulse light.

Thus, in the output permitted state where the output of the pulse light from the laser light-source apparatus 1 is permitted with the power of the excitation light for the solid state amplifier 50 maintained, the control unit 100 drives the seed light source 10 under the pulse oscillation mode to cause the seed light source 10 to oscillate pulse light based on gain switching. In the output stopped state where the output of the pulse light from the laser light-source apparatus 1 is stopped, the control unit 100 drives the seed light source 10 under the continuous oscillation mode to cause the seed light source 10 to oscillate continuous light. Furthermore, the control unit 100 adjusts the power of the laser beam input from the seed light source 10 to the solid state amplifier 50 in the continuous oscillation mode, in such a manner that the solid state amplifier 50 outputs light with substantially the same average power in the output stopped state and in the output permitted state.

When the output permitted state transitions to the output stopped state with the power of the excitation light for the solid state amplifier 50 maintained, the excitation energy accumulated in the amplifier due to the excitation light is consumed by the continuous light output from the seed light source 10 in the continuous oscillation mode. Thus, the excessive heat emission of the solid state amplifier 50 changing the amplification characteristics can be prevented with no cumbersome control for switching the power of the excitation light for the solid state amplifier 50. Thus, the pulse light can be output with stable amplification characteristics, when the transition to the output permitted state occurs thereafter.

When the excitation state of the solid state amplifier 50 due to the excitation light fluctuate, the optical axis of the pulse light output from the solid state amplifier 50 slightly fluctuates due to the influence of thermal lens effect or the like. This might have a large impact on the processing accuracy of the processing target object for example. Thus, stable thermal state of the solid state amplifier is desired to be maintained even when the output permitted state transitions to the output stopped state. When the output permitted state transitions to the output stopped state, the excitation energy accumulated in the solid state amplifier 50 may be consumed by the continuous light output from the seed light source 10 in the continuous oscillation mode. With this configuration, the stable thermal state of the solid state amplifier 50 is maintained even when the power of the excitation light for the solid state amplifier 50 is maintained. As a result, the beam propagation characteristics do not degrade due to the change in the temperature characteristics of the solid state amplifier 50 even when the transition to the output permitted state occurs thereafter. All things considered, the processing accuracy of the processing target object can be appropriately maintained.

The power of the pulse light after the wavelength conversion by the wavelength conversion elements (the nonlinear optical elements) 60 and 70 has positive correlation with the power of the input light. Thus, the intensity needs to be amplified to a sufficient level with the solid state amplifier 50, with the seed light source 10 driven in the pulse oscillation mode with which the pulse light with high peak power can be obtained. However, the power of the continuous light output from the seed light source 10 in the continuous oscillation mode is low. Thus, the wavelength converted light with sufficient power cannot be obtained from the wavelength conversion elements 60 and 70 even when such light is amplified by the solid state amplifier 50.

Thus, in the output stopped state in which the output of the pulse light from the nonlinear optical elements 60 and 70 is stopped, the seed light source 10 may be switched from the pulse oscillation mode to the continuous oscillation mode to be driven. Thus, the output stopped state can substantially be achieved with the stable thermal state of the solid state amplifier 50 maintained. Thus, the nonlinear optical elements 60 and 70 function as a filter element that selectively converts the wavelength of the pulse light output from the seed light source 10, regardless of whether the oscillation wavelengths are the same or different from each other, so that the pulse light can be output with power high enough to process the processing target object.

Figure 4:
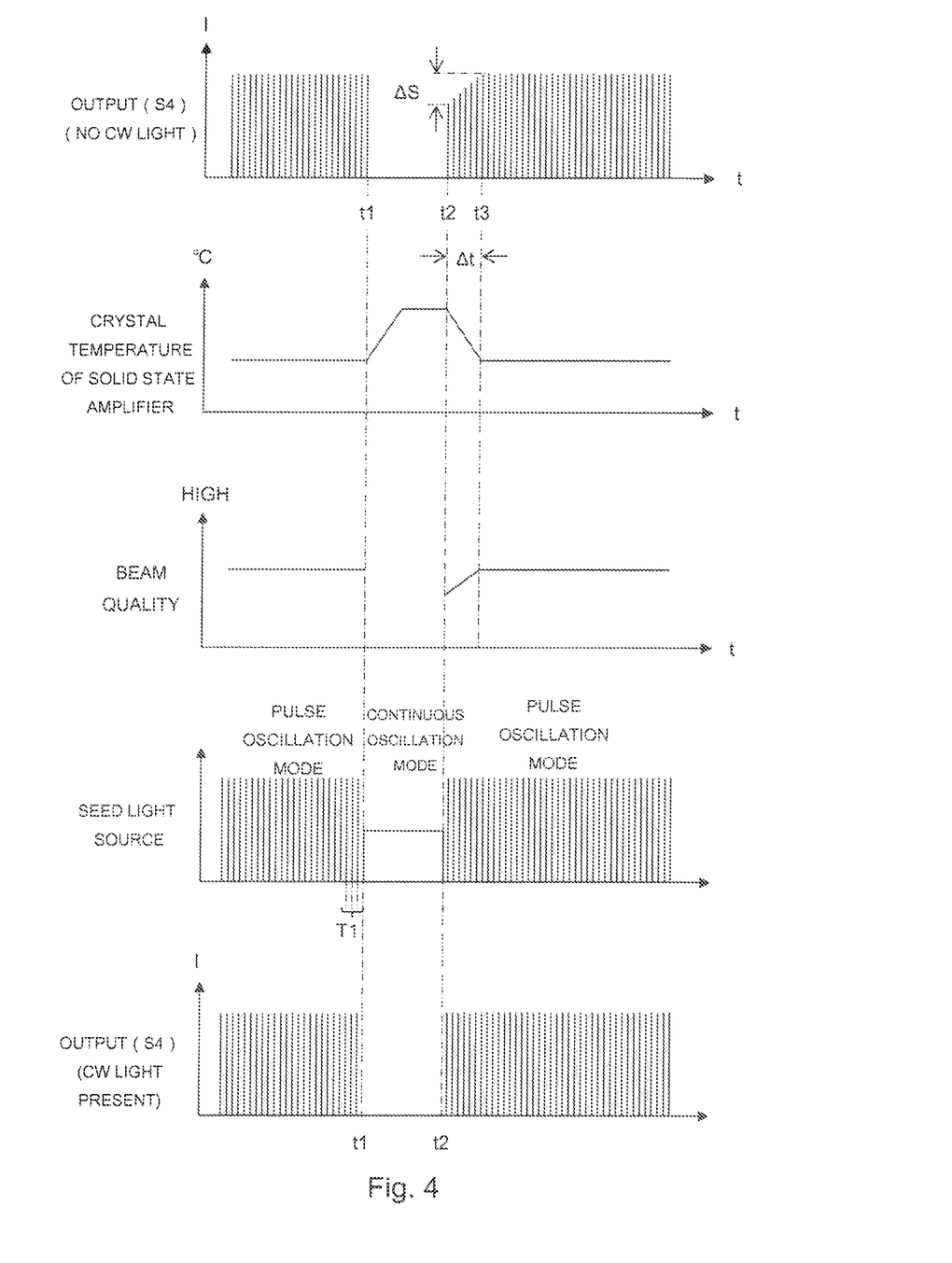
FIG. 4 is a diagram illustrating output fluctuation and stabilization occurring in a transition from an output stopped period to an output permitted period.

FIG. 4 illustrates characteristics of the solid state amplifier 50 during a transition from the output permitted state to the output stopped state, and to the output permitted state. As can be seen in the uppermost section in FIG. 4 (output (S4) (no CW light)), when the transition from the output permitted state to the output stopped state is achieved at a time point t1 and the seed light source 10 is OFF in the output stopped state, power reduction ΔS occurs due to the degradation of the beam propagation characteristics in a time period Δt between a time point t2, at which transition from the output stopped state to the output permitted state is achieved again and a time point t3 thereafter.

As illustrated in a second section (crystal temperature of the solid state amplifier) in FIG. 4, the crystal temperature of the solid state amplifier, which has been at a substantially constant level in the output permitted state, gradually rises after the time point t1 due to the energy accumulated by the excitation light during the output stopped state. Then, the power reduction ΔS described above occurs due to the phenomenon occurring during the time period Δt between the time point t2 at which the output permitted state is restored and a point at which the crystal temperature at the constant level described above is achieved and the degradation of the beam quality from the previous quality at the constant level as illustrated in a third section (beam quality) in FIG. 4. The time period Δt, which is variable depending on the length of the output stopped state, is approximately 0.5 seconds to 60 seconds.

Thus, as illustrated in a fourth section (seed light source) in FIG. 4, in the laser light source apparatus 1 according to the present invention, the control unit 100 performs control in such a manner that the seed light source 10 switched from the pulse oscillation mode to the continuous oscillation mode in the output stopped state during a period between the time point t1 and the time point t2, and returns to the pulse oscillation mode in the output permitted state at and after the time point t2.

The CW light output from the seed light source 10 in the output stopped state propagates to the solid state amplifier 50 via the optical switching element 40. Thus, the energy in the active region of the solid state amplifier 50 in the excited state achieved by the light source 51 for excitation is discharged.

As a result, as illustrated in the lowermost section (output (S4) (CW light present) in FIG. 4, the temperature rise due to excessive heat emitted from the solid state amplifier 50 in response to the excitation energy does not occur. Thus, immediately after the output from the wavelength conversion unit 1D resumes with the control unit 100 achieving the pulse oscillation mode at the time point t2 at the end of the output stopped state so that the pulse light output from the seed light source 10 propagates to the solid state amplifier 50, no degradation of the beam propagation characteristics occurs and the processing can be stably resumed with no negative impact on the quality of the processing target.

Specifically, as illustrated in FIG. 1, the driver D10 is provided with a feedback control circuit that performs feedback control on an intensity of the output from the seed light source 10 driven in the continuous oscillation mode, based on the amount of light input to the photodiode PD from the demultiplexer 24. Thus, the control unit 100 adjusts the intensity of the output from the seed light source 10, via the driver D10. The demultiplexer 24 may be positioned on the output side of the fiber amplifier 30 on the downstream stage.

The feedback control circuit may be omitted when the power of the laser light output from the seed light source 10 driven in the continuous oscillation mode can be adjusted in such a manner that the solid state amplifier 50 can output light with substantially the same average power in the output stopped state and in the output permitted state.

The seed light source 10 is switched from the pulse oscillation mode to the continuous oscillation mode, when the output permitted state transitions to the output stopped state. Preferably, the switching to the continuous oscillation mode is achieved in such a manner that the continuous light is output in synchronization with the pulse rate T1 of the pulse light (see the fourth section (seed light source) in FIG. 4). Laser light with high power is output through relaxation oscillation as in the pulse oscillation mode, at the initial stage of the output of the laser beam in the continuous oscillation mode. This light is emitted onto the processing target after the wavelength conversion. When this timing is different from the pulse rate of the pulse light, nonuniform processing occurs.

Figure 5:
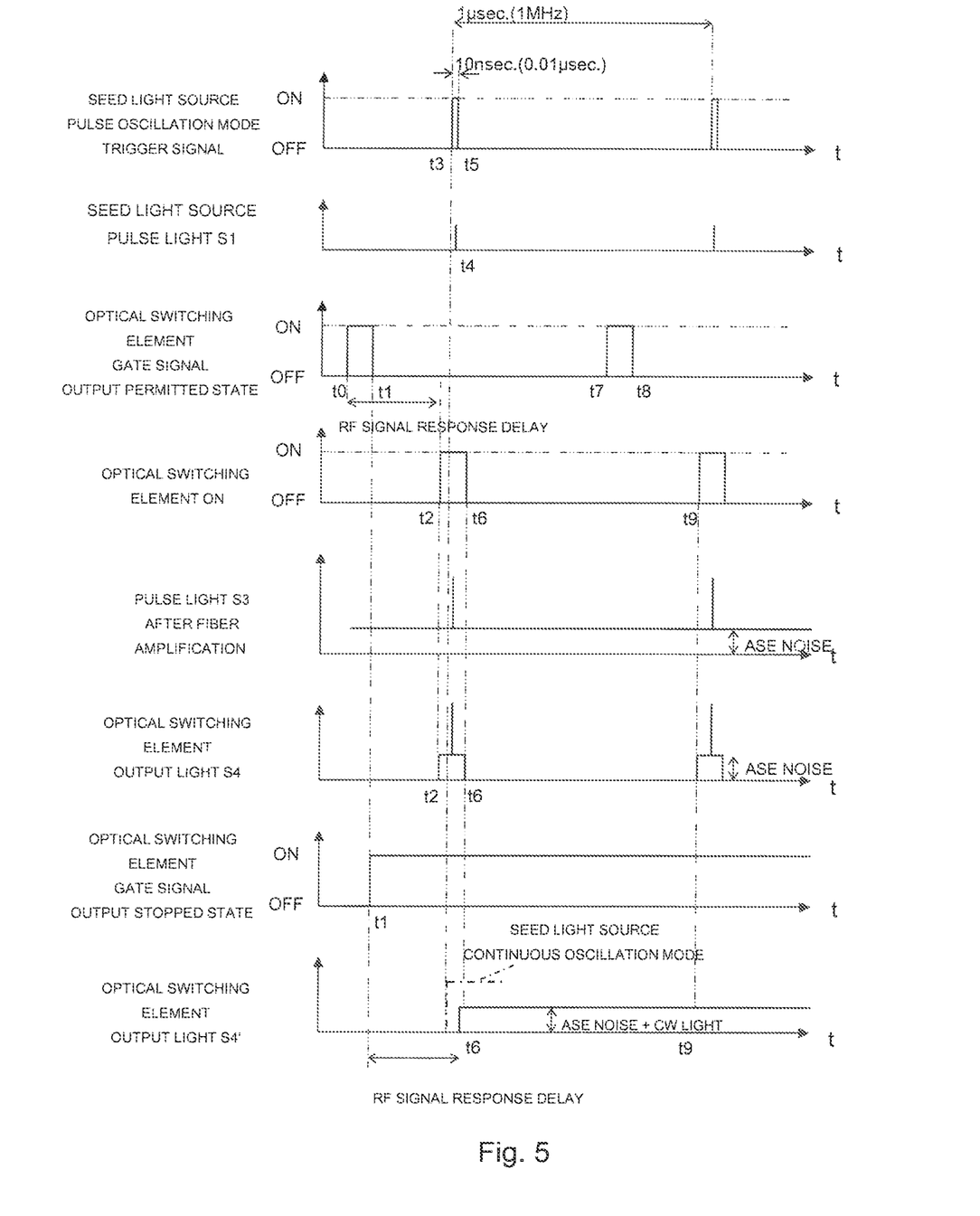
FIG. 5 is a timing chart illustrating timings for outputting a trigger signal for driving the seed light source and a gate signal for driving the optical switching element, in accordance with optical pulse output stopped and permitted states.

FIG. 5 is a timing chart illustrating an example of control performed by the control unit 100 on the seed light source 10 and the optical switching element 40.

In the output permitted state, the gate signal is output to the RF driver D2 of the optical switching element 40 at a reference time point t0, and after a predetermined time delay, the trigger signal is turned ON and output to the driver D1 of the seed light source 10 at a time point t3. At a time point t4, the relaxation oscillation occurs, and the trigger signal is turned OFF at a predetermined time point t5 after the time point t4. Thus, pulse light S1 having a predetermined pulse width is obtained, and pulse light S3 as a result of the amplification by the fiber amplifiers 20 and 30 is obtained. The pulse light S3 has an increased bandwidth and the ASE noise superimposed thereon.

A configuration where at the predetermined time point t5, the driver D1 causes the seed light source 10, in which the relaxation oscillation has occurred, to stop the laser emission may be employed instead of the configuration in which the control unit 100 turns OFF the trigger signal at the time point t5 to stop the laser oscillation. In such a case, the trigger signal may be turned OFF at any timing.

The optical switching element 40 is turned ON at the time point t2 with the gate signal, turned ON and output at the time point to, and is turned OFF at the time point t6 with the gate signal turned OFF at the time point t1. Output S4, which has been amplified by the fiber amplifier 30 and has passed through the optical switching element 40, propagates to the solid state amplifier 50 within the period between the time points t2 and t6 during which the optical switching element 40 is ON.

Thus, the output light S4, which has been amplified by the fiber amplifier 30 and has passed through the optical switching element 40, that is, pulse light S4 output from the seed light source 10 is propagated to the solid state amplifier 50 within the period between the time points t2 and t6 during which the optical switching element 40 is ON. The ASE noise is prevented from propagating to the solid state amplifier 50 in a period between the time points t6 to t9 during which the optical switching element 40 is OFF. Thus, the excitation energy accumulated in the active region of the solid state amplifier 50 is prevented from being wastefully consumed.

In the output stopped state, the gate signal is output to the RF driver D2 of the optical switching element 40 at a reference time point t1, and after a predetermined time delay, a continuous oscillation mode driving signal is turned ON to be output to the driver D1 of the seed light source 10 at the time point t3.

Output light S4', as a result of the CW light output from the seed light source 10 passing through the optical switching element 40 together with the ASE noise, propagates to the solid state amplifier 50.

In FIG. 5, the ON state illustrated represents a state where the diffraction grating is formed in the optical switching element 40 due to the RF signal input, and thus the diffracted light propagates to the solid state amplifier 50. The OFF state illustrated represents a state where no diffraction grating is formed in the optical switching element 40, so that no light propagates to the solid state amplifier 50, and zero order light is attenuated by the damper. The control signal output to the optical switching element 40 may be a positive logic signal or may be a negative logic signal.

Thus, a laser pulse light generating method is implemented that includes driving the seed light source 10 by the control unit 100 with the pulse oscillation mode of oscillating pulse light based on gain switching switched to the continuous oscillation mode of oscillating continuous light, with the power of the excitation light for the solid state amplifier 50 maintained, and adjusting by the control unit 100 the power of the laser beam input from the seed light source 10 to the solid state amplifier 50 in the continuous oscillation mode, so that the solid state amplifier 50 outputs light with substantially the same average power as in the state where the output of the pulse light from the nonlinear optical elements 60 and 70 is permitted, when the output of the pulse light from the nonlinear optical elements 60 and 70 is stopped.

The present invention can be widely applied to laser light-source apparatuses that uses a seed light source that is driven by a frequency of several hundreds of megahertz or lower and a pulse width of several hundreds of picoseconds or shorter, as semiconductor lasers including a DFB laser.

Another embodiment of the present invention is described below.

In an example in the embodiment described above, the power of the laser light output from the seed light source 10 in the continuous oscillation mode to be input to the solid state amplifier 50 is adjusted in such manner that the solid state amplifier 50 outputs the light with substantially the same average power in the output stopped state and in the output permitted state. Alternatively, intermittent driving may be employed to adjust output duration while maintaining the power of the laser light output from the seed light source 10, or the power and the output duration may both be adjusted.

The output duration of laser light from the seed light source 10 may be adjusted with the following modes: a mode with a driving period in which the seed light source 10 outputs the laser light controlled; and a mode with the optical switching element 40 controlled in such a manner that the period in which the laser light output from the seed light source 10 propagates to the solid state amplifier 50 is controlled.

In the embodiment described above, an example is described where the energy in the active region accumulated in the solid state amplifier 50 is effectively utilized in the output permitted state by controlling the optical switching element 40 in such a manner that the propagation of light is permitted during a period in which the pulse light is output from the seed light source 10 driven in the pulse oscillation mode, and is stopped during a period other than the period in which the pulse light is output from the seed light source 10. However, ON/OFF control needs not to be performed constantly on the optical switching element 40 in the output permitted state.

For example, the ON/OFF control may be performed on the optical switching element 40 when the pulse rate is low (equal to or lower than a megahertz), and the ON control may be constantly performed on the optical switching element 40 when the pulse rate is higher than that.

Figure 6:
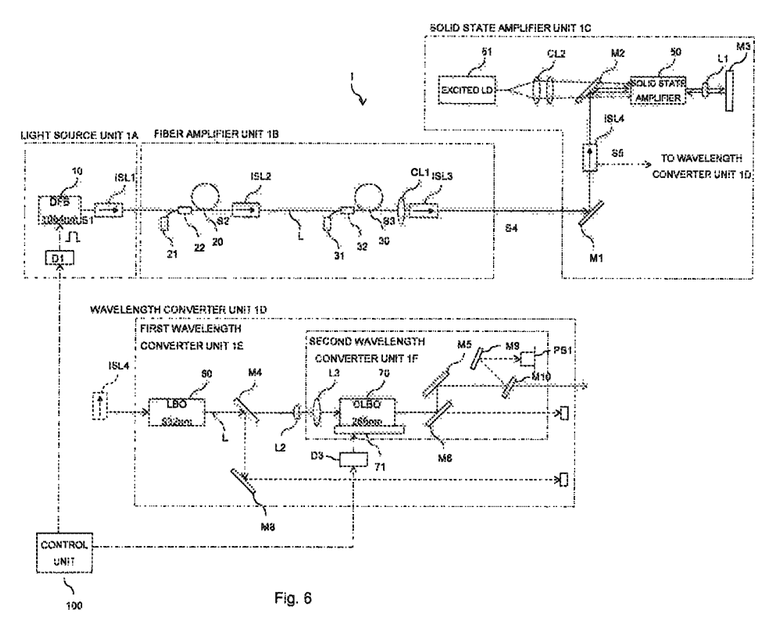
FIG. 6 is a block diagram illustrating a configuration of a laser light-source apparatus according to another embodiment of the present invention.

As illustrated in FIG. 6, the ON/OFF control needs not to be performed on the optical switching element 40 in the output permitted state, when the prevention of the fluctuation of the characteristics of the solid state amplifier 50 in the output stopped state is the only object. Instead, control may be performed in such a manner that output light from the fiber amplifier 30 propagates to the reflection mirror M1. In this configuration, the optical switching element 40 can be omitted.

In the embodiment described above, an example is described where the control unit 100 adjusts the power of the laser beam input from the seed light source to the amplifier in the continuous oscillation mode, in such a manner that the solid state amplifier 50 outputs light with substantially the same average power in the output stopped state and in the output permitted state. Such control may also be performed for the fiber amplifiers 20 and 30.

A bandpass filter may be further provided on the downstream stage of the fiber amplifiers 20 and 30 in the embodiment described above. The bandpass filter reduces the bandwidth of pulse light having an increased bandwidth due to chirping effect, self-phase modulation and Raman scattering in an optical fiber, or the like.

A bandpass filter may also be provided between the seed light source 10 and the optical isolator ISL1 and between the optical isolator ISL1 and the fiber amplifier 20 to prevent the ASE noise from being reflected to the seed light source.

In the embodiment described above, an example is described where the acousto-optic element that turns ON or OFF the primary diffracted light in accordance with the turning ON or OFF of the ultrasound transducer is used as the optical switching element 40. Alternatively, an electro-optic element that turns ON and OFF light with an electric field in accordance with intensity modulation through EO modulation may be used as the optical switching element 40.

An extremely small rocking mirror, made by a micromachining technique (a mirror including Micro Electro Mechanical Systems (MEMS)), may be used as the optical switching element 40. Here, the propagation of the output from the fiber amplifier 30 to the solid state amplifier 50 may be permitted or stopped by switching a rocking angle of the extremely small rocking mirror. Furthermore, a polarization device that can control transmission and blocking of light by dynamically switching a polarization state may be used. In other words, the optical switching element may include a dynamic optical element.

In the embodiment described above, an example is described where the DFB laser is used as the seed light source and employs the gain switching in the pulse oscillation mode to generate single longitudinal mode pulse light having a higher intensity than in a normal state. In the present invention, any semiconductor laser may be used as the seed light source, and thus a general Fabry-Perot semiconductor laser other than the DFB laser may be used.

More specifically, in a state where the power of excitation light for the amplifier is maintained, the power of the laser beam output from the seed light source 10 in the continuous oscillation mode to be input to the solid state amplifier 50 is adjusted in such a manner that the solid state amplifier 50 outputs light with substantially the same average power in the output stopped state and in the output permitted state. The present invention may also be applied to the fiber amplifiers 20 and 30.

In such a configuration, the excessive heat emission of the amplifier changing the amplification characteristics can be prevented with no cumbersome control for switching the power of the excitation light for the amplifier when the transition from the output permitted state to the output stopped state occurs. Thus, the pulse light can be output with stable amplification characteristics, when the transition to the output permitted state occurs thereafter.

The present invention may be applied to a laser light-source apparatus not including the nonlinear optical elements 60 and 70. In this configuration, an optical switching element that enables and disables the output of light is further provided on the subsequent stage of the solid state amplifier 50, and the control unit 100 may control the optical switching element in such a manner that the output of light from the laser light-source apparatus is stopped in the output stopped state and is permitted in the output permitted state. This optical switching element may include an element that is the same as that of the optical switching element 40.

The present invention is not limited to the seed light source with an oscillation wavelength of 1064 nm. For example, seed light sources with different wavelengths, such as 1030 nm, 1550 nm, and 976 nm, may be selected as appropriate for different applications. Furthermore, these wavelengths may be used as the fundamental waves to generate harmonics, slim frequencies, and difference frequencies through the nonlinear optical element. A nonlinear optical element different from that described above may be used. For example, a BBO crystal, a KBBF crystal, an SBBO crystal, a KABO crystal, a BABO crystal, or the like may be used instead of the CLBO crystal.

Each of the plurality of embodiments described above is described as one embodiment of the present invention, and the scope of the present invention is not limited by the description. It is a matter of course that the specific circuit configurations of each component and optical elements used for circuits may be selected as appropriate or designed differently as long as the effects of the present invention are obtained.

1: Laser light-source apparatus
10: Seed light source
20, 30: Fiber amplifiers
40: Optical switching element
50: Solid state amplifier
60, 70: Nonlinear optical element
100: Control unit

The invention claimed is:

1. A laser light-source apparatus comprising:
a seed light source configured to output pulse light based on gain switching;
an amplifier configured to amplify the pulse light output from the seed light source; and
a control unit configured to perform control in such a manner that the seed light source is driven in a pulse oscillation mode of oscillating the pulse light based on the gain switching in an output permitted state where output of the pulse light from the laser light-source apparatus is permitted, and is driven in a continuous oscillation mode of oscillating continuous light in an output stopped state in which the output of the pulse light from the laser light-source apparatus is stopped, with power of excitation light for the amplifier maintained, and to adjust power of laser light input to the amplifier from the seed light source in the continuous oscillation mode in such a manner that the amplifier outputs light with substantially same average power in the output stopped state and in the output permitted state.

2. The laser light-source apparatus according to claim 1, wherein the amplifier at least includes a solid state amplifier, and wherein the control unit is configured to adjust the power of laser light input to the solid state amplifier from the seed light source in the continuous oscillation mode in such a manner that the solid state amplifier outputs light with substantially same average power in the output stopped state and in the output permitted state.

3. The laser light-source apparatus according to claim 2, further comprising:

a nonlinear optical element configured to perform wavelength conversion on the pulse light output from the solid state amplifier and output the resultant pulse light, wherein the nonlinear optical element is configured to output wavelength converted light with predetermined power only in the output permitted state.

4. The laser light-source apparatus according to claim 3, wherein the light source includes a distributed feedback (DFB) laser, and wherein the control unit is configured to drive the DFB laser with a frequency of several megahertz or lower and a pulse width of several hundreds of picoseconds or shorter.

5. The laser light-source apparatus according to claim 2, wherein the light source includes a distributed feedback (DFB) laser, and wherein the control unit is configured to drive the DFB laser with a frequency of several megahertz or lower and a pulse width of several hundreds of picoseconds or shorter.

6. The laser light-source apparatus according to claim 1, wherein the seed light source includes a distributed feedback (DFB) laser, and wherein the control unit is configured to drive the DFB laser with a frequency of several megahertz or lower and a pulse width of several hundreds of picoseconds or shorter.

7. A laser pulse light generating method in which pulse light output from a seed light source based on gain switching is sequentially amplified by a fiber amplifier and a solid state amplifier, subjected to wavelength conversion by a nonlinear optical element, and then is output, the method comprising:

driving the seed light source with a pulse oscillation mode of oscillating the pulse light based on the gain switching switched to a continuous oscillation mode of oscillating continuous light, with power of excitation light for the solid state amplifier maintained and adjusting power of laser light input to the solid state amplifier from the seed light source in the continuous oscillation mode in such a manner that the solid state amplifier outputs light with substantially the same average power as in the state where the output of the pulse light from the nonlinear optical element is permitted, when the output of the pulse light from the nonlinear optical element is permitted.

* * * * *